US009607859B2

(12) United States Patent
Lorenti et al.

(10) Patent No.: US 9,607,859 B2
(45) Date of Patent: Mar. 28, 2017

(54) PROCESS FOR MANUFACTURING A SEMICONDUCTOR POWER DEVICE COMPRISING CHARGE-BALANCE COLUMN STRUCTURES AND RESPECTIVE DEVICE

(71) Applicant: STMICROELECTRONICS S.R.L., Agrate Brianza (IT)

(72) Inventors: Simona Lorenti, Catania (IT); Cateno Marco Camalleri, Catania (IT); Mario Giuseppe Saggio, Aci Bonaccorsi (IT); Ferruccio Frisina, S. Agata Li Battiati (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 14/788,685

(22) Filed: Jun. 30, 2015

(65) Prior Publication Data
US 2015/0325640 A1 Nov. 12, 2015

Related U.S. Application Data

(62) Division of application No. 13/597,133, filed on Aug. 28, 2012, now Pat. No. 9,099,322, which is a division
(Continued)

(51) Int. Cl.
*H01L 29/76* (2006.01)
*H01L 29/94* (2006.01)
(Continued)

(52) U.S. Cl.
CPC .... *H01L 21/3247* (2013.01); *H01L 21/02057* (2013.01); *H01L 21/0262* (2013.01);
(Continued)

(58) Field of Classification Search
CPC .......................... H01L 29/063; H01L 29/0634
(Continued)

(56) References Cited

U.S. PATENT DOCUMENTS 6,228,719 B1   5/2001  Frisina et al.
6,300,171 B1  10/2001  Frisina
(Continued)

FOREIGN PATENT DOCUMENTS

WO        0145155     6/2001
WO      2007116420   10/2007
WO      2007122646   11/2007

*Primary Examiner* — Cuong Q Nguyen
(74) *Attorney, Agent, or Firm* — Seed IP Law Group LLP

(57) ABSTRACT

Process for manufacturing a semiconductor power device, wherein a trench is formed in a semiconductor body having a first conductivity type; the trench is annealed for shaping purpose; and the trench is filled with semiconductor material via epitaxial growth so as to obtain a first column having a second conductivity type. The epitaxial growth is performed by supplying a gas containing silicon and a gas containing dopant ions of the second conductivity type in presence of a halogenide gas and occurs with uniform distribution of the dopant ions. The flow of the gas containing dopant ions is varied according to a linear ramp during the epitaxial growth; in particular, in the case of selective growth of the semiconductor material in the presence of a hard mask, the flow decreases; in the case of non-selective growth, in the absence of hard mask, the flow increases.

18 Claims, 12 Drawing Sheets

Related U.S. Application Data of application No. 12/296,921, filed as application No. PCT/IT2006/000244 on Apr. 11, 2006, now Pat. No. 8,304,311.

(51) Int. Cl.

| | | |
|---|---|---|
| *H01L 21/324* | (2006.01) | |
| *H01L 27/088* | (2006.01) | |
| *H01L 21/02* | (2006.01) | |
| *H01L 29/06* | (2006.01) | |
| *H01L 29/10* | (2006.01) | |
| *H01L 29/66* | (2006.01) | |
| *H01L 29/739* | (2006.01) | |
| *H01L 29/78* | (2006.01) | |
| *H01L 21/3065* | (2006.01) | |
| *H01L 29/73* | (2006.01) | |
| *H01L 29/861* | (2006.01) | |
| *H01L 29/872* | (2006.01) | |

(52) U.S. Cl.
CPC .. *H01L 21/02381* (2013.01); *H01L 21/02532* (2013.01); *H01L 21/02579* (2013.01); *H01L 21/02639* (2013.01); *H01L 21/324* (2013.01); *H01L 27/088* (2013.01); *H01L 29/0634* (2013.01); *H01L 29/1095* (2013.01); *H01L 29/66712* (2013.01); *H01L 29/7395* (2013.01); *H01L 29/7802* (2013.01); *H01L 21/3065* (2013.01); *H01L 29/73* (2013.01); *H01L 29/8611* (2013.01); *H01L 29/872* (2013.01)

(58) Field of Classification Search
USPC ................................................ 257/335–346
See application file for complete search history.

(56) References Cited

U.S. PATENT DOCUMENTS

| | | |
|---|---|---|
| 6,404,010 B2 | 6/2002 | Saggio et al. |
| 6,452,230 B1 | 9/2002 | Boden |
| 6,495,294 B1 | 12/2002 | Yamauchi et al. |
| 6,586,798 B1 | 7/2003 | Frisina |
| 6,768,169 B2 * | 7/2004 | Tihanyi ............... H01L 29/0634 257/339 |
| 8,455,318 B2 | 6/2013 | Guarnera et al. |
| 2003/0025124 A1 | 2/2003 | Deboy |
| 2003/0219933 A1 | 11/2003 | Yamauchi et al. |
| 2003/0224588 A1 | 12/2003 | Yamauchi et al. |
| 2004/0016959 A1 | 1/2004 | Yamaguchi et al. |
| 2004/0185665 A1 | 9/2004 | Kishimoto et al. |
| 2005/0006717 A1 | 1/2005 | Yamaguchi et al. |
| 2005/0221547 A1 | 10/2005 | Yamauchi et al. |
| 2005/0233539 A1 | 10/2005 | Takeuchi |
| 2006/0006458 A1 * | 1/2006 | Motai ................ H01L 29/0634 257/330 |

* cited by examiner

PROCESS FOR MANUFACTURING A SEMICONDUCTOR POWER DEVICE COMPRISING CHARGE-BALANCE COLUMN STRUCTURES AND RESPECTIVE DEVICE

CROSS REFERENCE TO RELATED APPLICATIONS

This application is related to U.S. Pat. No. 8,455,318 issued Jun. 4, 2013entitled PROCESS FOR MANUFACTURING A POWER SEMICONDUCTOR DEVICE HAVING CHARGE-BALANCE COLUMNAR STRUCTURES ON A NON-PLANAR SURFACE, AND CORRESPONDING POWER SEMICONDUCTOR DEVICE, which is incorporated herein by reference in its entirety.

TECHNICAL FIELD

An embodiment of the present disclosure relates to a process for manufacturing a semiconductor power device and to the corresponding device. More specifically, an embodiment of the disclosure relates to a process for manufacturing a power device of the type comprising column structures used for charge balancing of the device and to the corresponding device.

An embodiment of the disclosure regards, in particular, but not exclusively, a process for manufacturing a vertical-conduction power device (for example, a power MOS device or else a device of the Insulated-Gate Bipolar Transistor (IGBT) type or else a device of the Bipolar Junction Transistor (BJT) type or else bipolar diodes or Schottky diodes) and to the corresponding device, and the following non-limiting description relates to this application field for the purpose of explaining related concepts.

BACKGROUND

In the last few years the endeavor has been to increase the efficiency of the above devices for increasing their breakdown voltage and reducing their output resistance.

U.S. Pat. Nos. 6,586,798 B1, 6,228,719 B1, 6,300,171 B1 and 6,404,010, all commonly assigned and incorporated by reference, describe methods for solving the problems set forth above. These patents describe power MOS devices comprising column structures having a first conductivity type (for example, a P type), spaced by epitaxial layer portions having a second conductivity type (here, an N type). Basically, in order to form the column structures, a plurality of epitaxial layers of N type are sequentially grown, each growth being followed by an implantation of dopant of P type. Stacking of the implanted regions thus forms column structures, which represents an extension of the body regions of the device within the epitaxial layer that constitutes the drain region of the device. The charge concentration of the dopant introduced via the implantations, i.e., the concentration of the column structures of P type thus formed, is equal to, but of opposite sign with respect to, the concentration of charge introduced epitaxially. Consequently, by virtue of the charge balance thus obtained, vertical-conduction power devices can be provided with high breakdown voltage and with low output resistance, on account of the high concentration of the epitaxial layer (MD technology).

In addition, it is also known that, by increasing the density of the elementary strips that form the device, i.e., by increasingly packing the device, it is possible to further increase the charge concentration of the epitaxial layer, obtaining devices which, given a same breakdown voltage (linked to the height of the columns), have increasingly lower output resistance.

On the other hand, however, in order to increase the density of the elementary strips of the device, one increases the number of steps of epitaxial growth and reduces the thermal change undergone by the device. This may bring about an increase in the device cost, in the cycle time, and in the defects created by the various steps of epitaxial growth. In particular, with reference to the latter problem, each defect left at the interface between one epitaxial layer and the subsequent one may render the device less efficient.

Moreover, solutions exist for obtaining charge balance by forming trenches and filling the trenches with successive polysilicon, thermal oxide, and deposited oxide layers. However, these solutions may not solve the problem of defectiveness.

SUMMARY

An embodiment of the present disclosure is a process for manufacturing a power device of the type indicated above that may solve problems of known solutions in a simple way and may reduce to a minimum the defectiveness present in the device.

BRIEF DESCRIPTION OF THE DRAWINGS

One or more embodiments are now described, purely by way of non-limiting example, with reference to the attached drawings, wherein.

DETAILED DESCRIPTION

Figure 1:
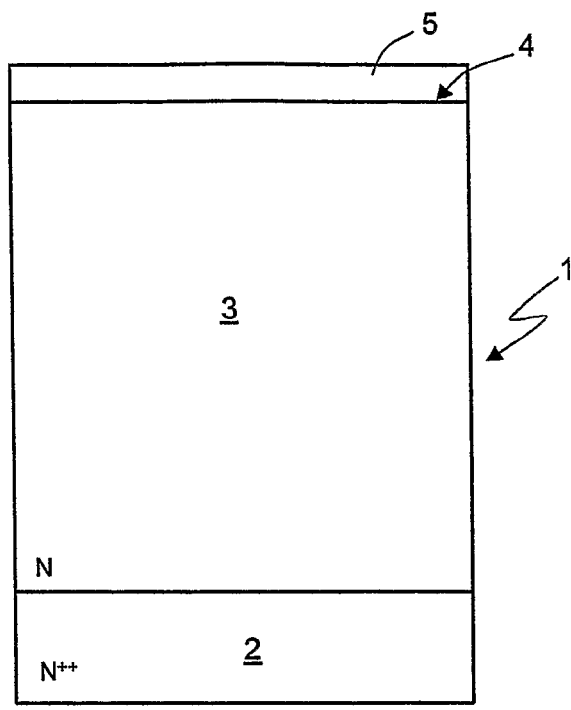
FIGS. 1 to 9 are cross-sections through a semiconductor wafer in successive manufacturing steps of the device, according to a first embodiment of the disclosure.

FIG. 1 shows a wafer 1 of semiconductor material, typically silicon, comprising a substrate 2 of an N++type, with a resistivity lower than, for example, 10 mΩ, and an epitaxial layer 3 of N type, with a resistivity comprised approximately between 2Ωand 10 mΩ. The wafer 1 has a surface orientation <100>. In addition, a hard-mask layer 5, for example of deposited silicon oxide, has already been provided on the top surface 4 of the epitaxial layer 3.

Figure 2:
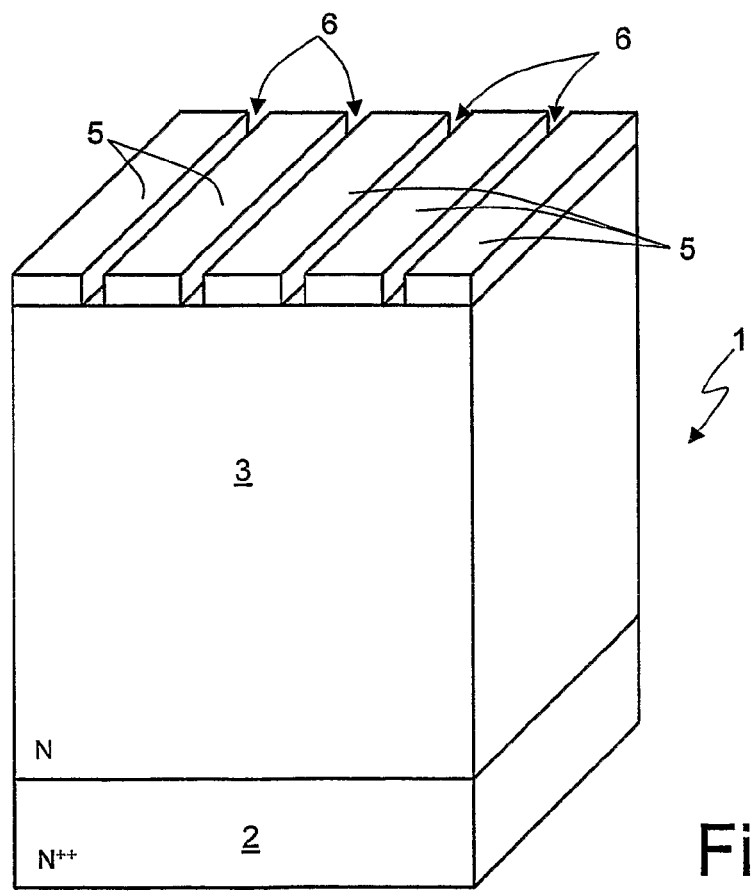

Then (FIG. 2), the hard-mask layer 5 is defined, by depositing a resist layer (not shown) and performing a lithographic etch and a dry etch so as to provide a hard mask, designated again by 5, formed by strips separated from each other by windows 6, which are also strip-shaped.

Figure 3:
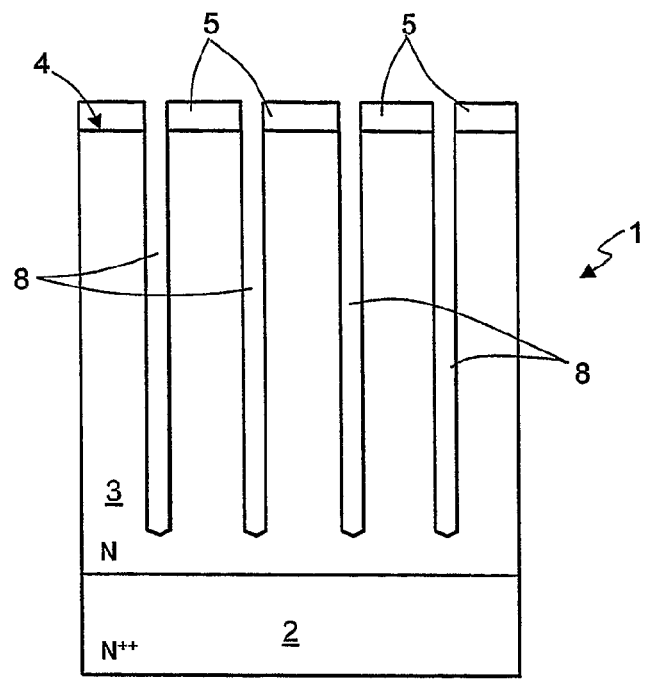

Using the hard mask 5, an anisotropic dry etch is carried out with an $SF_6/HBr/O_2$ mixture so as to form deep trenches 8 (FIG. 3). The trenches are provided in such a way that the width, at the level of the surface 4, may be comprised approximately between 0.8 and 2 μm, for example, 1 μm, while the width on the bottom may be approximately between 0.2 and 1.4 μm. The height of the trenches 8 varies from approximately 5 to 50 μm, and the distance between two trenches is approximately between 2 and 6 μm. The angle between the wall of the trenches 8 and the surface 4 of the epitaxial layer 3 may be moreover approximately between 85° and 89.5°.

Next, in order to eliminate the reaction products that adhere to the inside of the trenches 8, a first washing may be performed in a number of steps:
first step using $H_2SO_4+H_2O_2$;
second step using $NH_4OH+H_2O_2$; and
third step using $HCl+H_2O_2$.

Then, the wafer 1 may be subject to a first annealing at a high temperature in argon environment and in a dedicated (multi-wafer) reactor in order to eliminate the damage introduced by dry etching. In particular, the first annealing may be performed using the following parameters:
pressure: approximately 40-760 Torr;
argon flow: approximately 30-300 l/min;
temperature of the wafer 1: approximately 1000-1150° C.; and
treatment time: approximately 30 s-10 min.

Figure 4:
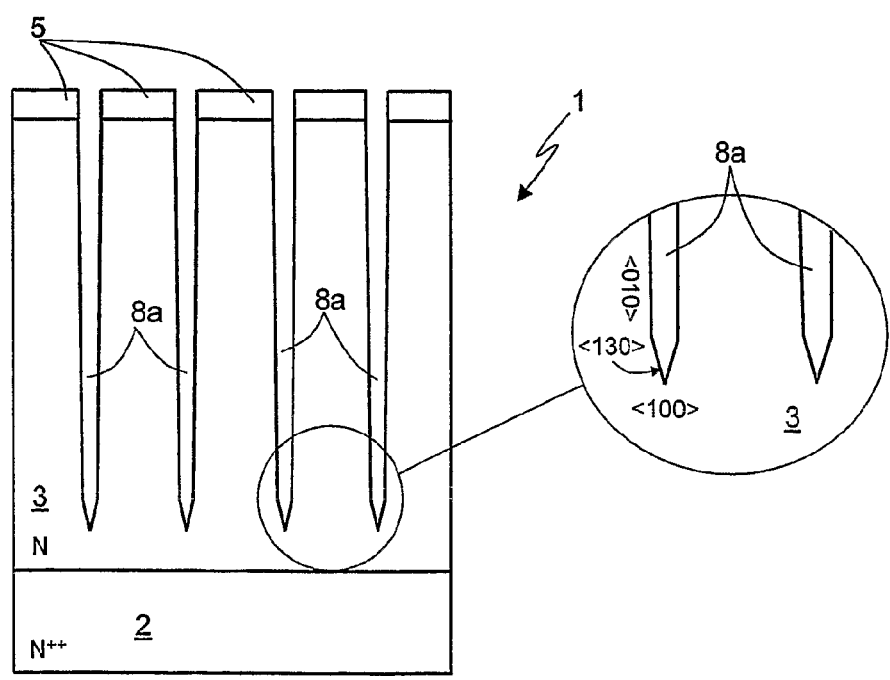
Figure 5:
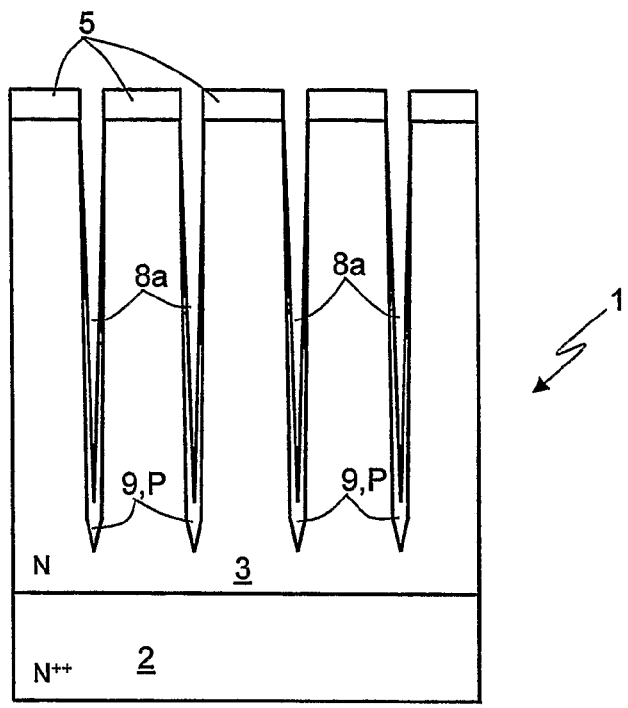
Figure 6:
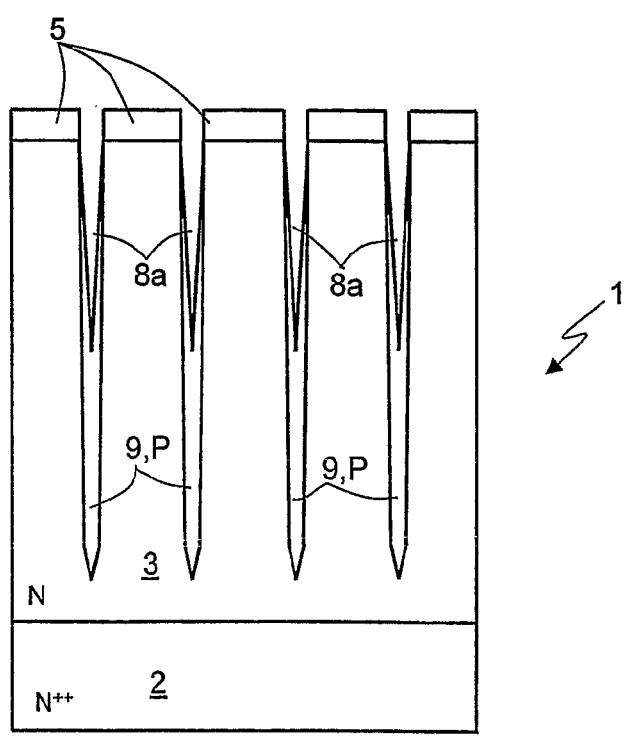
Figure 7:
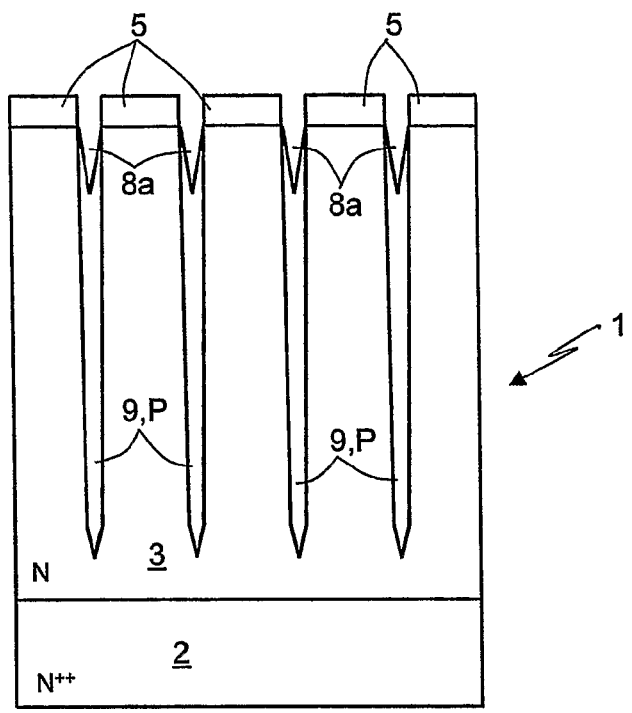

In this step, the annealing at high temperature in inert environment may lead to exposure, on the bottom of the trenches 8, of planes <100> and <130> and, along the side walls, of plane <010>, as may be seen from FIG. 4 and, in particular, from the enlarged detail. The trenches 8 may thus assume a new shape and are designated by 8a in FIG. 4 and the subsequent figures.

Next, the wafer 1 may undergo a second washing in a number of steps:
first step with $H_2SO_4+H_2O_2$;
second step with $NH_4OH+H_2O_2$;
third step with $HCl+H_2O_2$; and
fourth step with HF.

The wafer 1 may then be subjected to a second annealing in $H_2$ in a single-wafer LP-CVD chamber so as to eliminate any trace of native oxide. The parameters for this process may be:
pressure: approximately 40-400 Torr;
argon flow: approximately 30-60 l/m;
temperature of the wafer: approximately 800-950° C.; and
treatment time: approximately 5-10 m.

Next, in the same LPCVD chamber where the second annealing was performed, the trenches 8 may be filled, via selective epitaxial growth, with filling regions having a P doping obtained with boron. The epitaxial growth occurs by supplying flows of dichlorosilane (constituting a gas containing silicon) and diborane, and control of the doping may be obtained by maintaining a constant gradient in the flow of diborane, with a constant flow of dichlorosilane. In addition, the flow of diborane may be decreased with the time of growth. In particular, the intervals of values of the parameters for this step may be:
pressure approximately within the range 10-400 Torr, such as 30-200 Torr or 60-100 Torr, for example, 80 Torr;
flow of the $H_2$ vector approximately within the range 10-50 l, such as 15-30 l or 22-27 l, for example, 25 l;
temperature approximately within the range 750-1150° C., such as 800-1000° C. or 850-950° C., for example, 900° C.;
flow of $SiH_2CL_2$ approximately constant within approximately the range 0.2-0.5 slm (standard litres per minute), such as 0.25-0.4 slm, 0.30-0.35 slm, or 0.30-0.35 slm, for example, 0.32 slm;
flow of $B_2H_6$ according to a decreasing approximately linear ramp, varying from approximately 150 to 20 sccm, such as from 100 to 30 sccm, for example, from 80 to 40 sccm.

Figure 8:
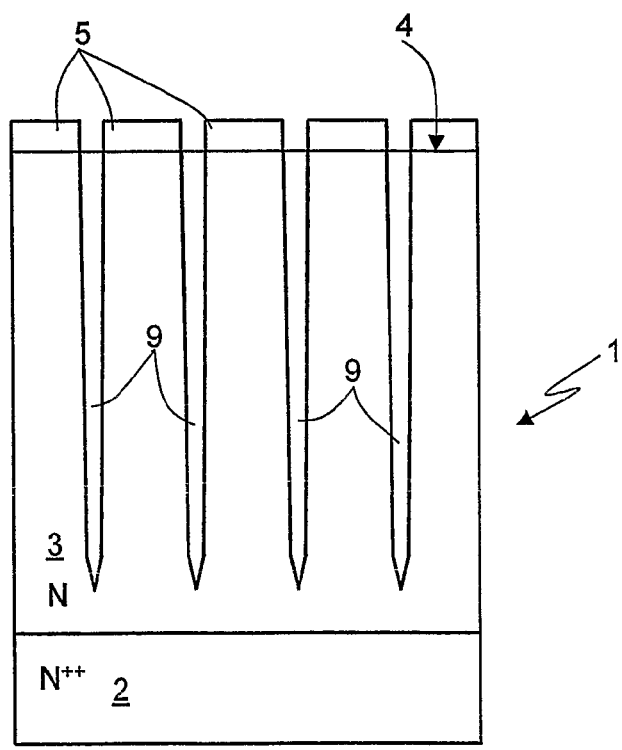

Use of a low temperature, together with selectivity, enables onset of a mechanism of growth from bottom up (hereinafter referred to also as "zip process"), which enables complete filling with substantially no voids to be obtained. In fact, in the conditions indicated, the transportation phenomena of the gas are notably less than in a chemical reaction. The evolution of the selective growth is shown in FIGS. 5-8 and leads to formation of filling regions or columns 9 that may be absolutely coplanar with the surface 4 of the substrate (FIG. 8).

In practice, the selective epitaxial growth may be ensured by the presence of the hard mask 5 and of a halogenide gas (HCl, which develops from the reaction $SiH_2Cl_{2(g)} \rightarrow Si_{(s)} + 2HCl_{(g)}$), by the low temperature, and by the low process pressure.

The flow of diborane may be such that the final value is always half the initial one. The initial value may be fixed by the target concentration, which may be calculated so as to ensure the charge balance necessary for the structure of the device that is to be obtained with the process described herein. For example, for a pitch (sum of the width of a trench 8 and of the distance between one trench and another) of 6 μm, and an N epitaxial concentration of 1 W/cm, the initial flow of diborane may be 80 sccm.

Figure 9:
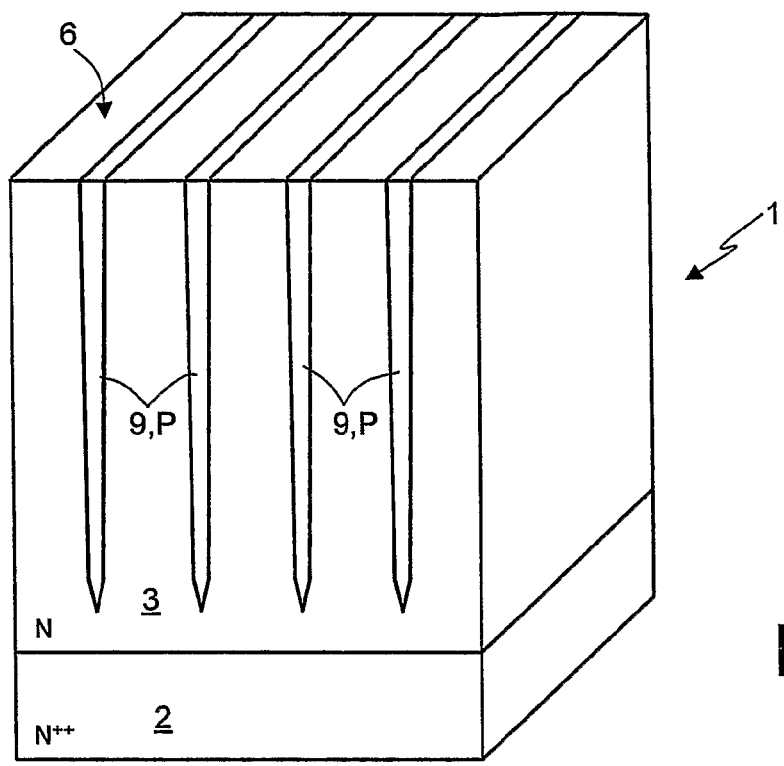

Finally the hard mask 5 may be removed (FIG. 9).

In this way, a structure may be obtained, which comprises a semiconductor body 1, having a first conductivity type, with a plurality of trenches 8a, each housing a column 9 of semiconductor material. The columns 9 house dopant ions having a second conductivity type, distributed in a spatially uniform way. The width of the columns 9 may be between 0.8 and 2 μm, the depth may be between 3 and 50 μm, for example, between 5 and 30 μm, and the aspect ratio may be between 1.5 and 62.5. The distance between two columns 9 may be between 2 and 6 μm, and the pitch (sum of the width of a column 9 and of the distance from an adjacent column 9) may be between 1 and 10 μm, for example, between 5 and 10 μm.

According to a second embodiment, no selective growth is performed. This embodiment comprises a series of initial steps, which may be the same as the ones described with reference to FIGS. 1-3 and comprise forming the hard mask 5 and digging the trenches 8 until the structure of FIG. 3 is obtained.

Next, in order to eliminate the reaction products that adhere to the inside of the trenches 8 and remove the hard mask 5, prior to epitaxial growth, a multistep washing may be performed:
first step: $H_2SO_4+H_2O_2$;
second step: $NH_4OH+H_2O_2$;
third step: $HCl+H_2O_2$; and
fourth step: HF.

Figure 10:
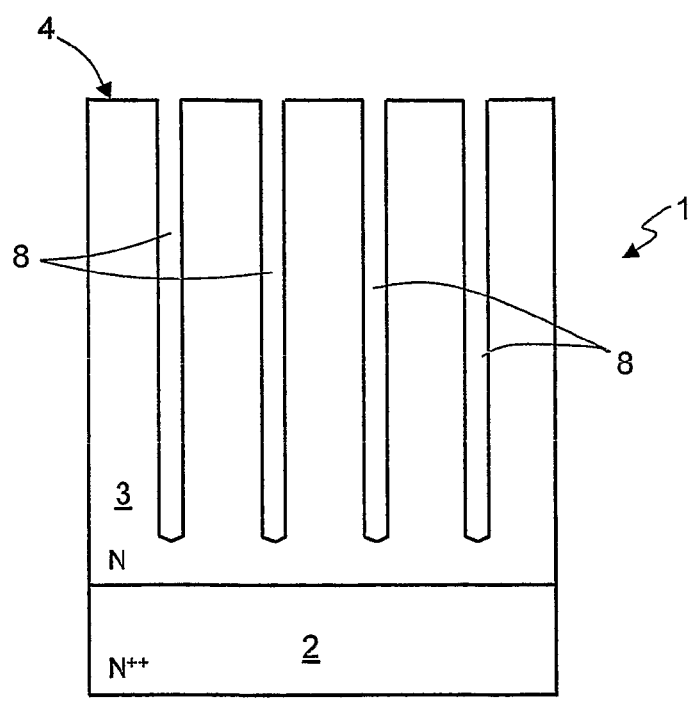
FIGS. 10 to 15 are cross-sections through a semiconductor wafer in successive manufacturing steps of the device, according to a second embodiment of the disclosure.

The structure illustrated in FIG. 10 may thus be obtained.

After this step, the wafer 1 may undergo annealing at a high temperature in hydrogen environment in a multi-wafer epitaxial reactor of a barrel type in order to eliminate the damage introduced by the dry etch and any trace of native oxide. The parameters for this process may be:
pressure: approximately 40-760 Torr;
flow of $H_2$: approximately 30-300 l/m;
temperature of the wafer 1: approximately 1000-1150° C.; and
treatment time: approximately 1-15 m.

Figure 11:
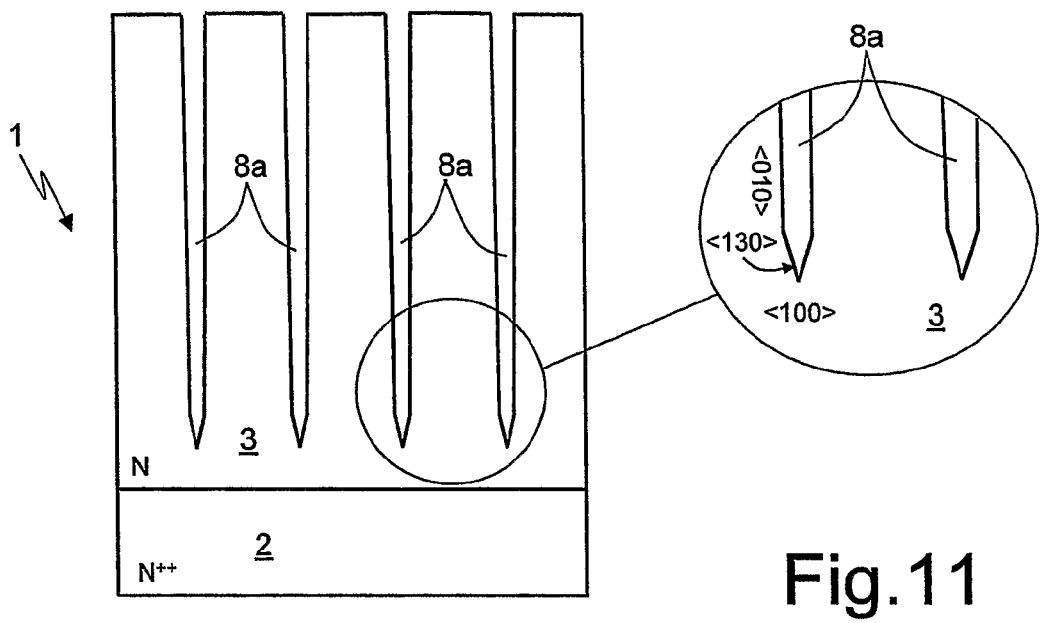

As described for the first embodiment, during the annealing at high temperature in inert environment, the planes <100> and <130> are exposed on the bottom of the trenches 8, and, along the walls, the plane <010>, as shown in the detail of FIG. 11. The trenches 8a may thus be obtained.

After annealing, in a single-wafer LPCVD epitaxial chamber, the trenches 8a may be epitaxially filled with silicon with a P doping (boron).

In this case, in view of the absence of the hard mask 5, and of the various process parameters, specified hereinafter, the growth proceeds both on the bottom of the trenches and on the walls, at a higher rate in the proximity of the surface 4 as compared to the bottom. This would produce a premature closing of the trenches 8a with consequent formation of a wide void within each trench 8a. For this reason, growth steps may be alternated with etching steps (multi-step process) so as to minimize the number and dimensions of the voids, which may be formed in the area where the two growth fronts come up against one another, starting from the walls, as highlighted by the sequence of FIGS. 12-14. In the example described below, the process comprises four epitaxial growths, separated by three etching steps.

Growth Step

In this step, control of doping is obtained by maintaining a substantially constant gradient in the flow of diborane and by maintaining the flow of dichlorosilane substantially constant. In this case, the flow of diborane increases with the growth time and, for example, the final value of flow of diborane is twice that of the initial flow, which is fixed by the target concentration. The concentration is calculated so as to ensure the charge balance necessary for the structure of the device that is to be made. The ranges of values of the parameters for this step may be:

- pressure approximately within the range 10-400 Torr, such as 30-200 Torr or 60-100 Torr, for example, 80 Torr;
- flow of the $H_2$ vector approximately within the range 10-50 l, such as 15-30 l or 22-27 l, for example, 25 l;
- temperature approximately within the range 750-1150° C., such as 800-1000° C. or 850-950° C., for example 900° C.;
- flow of $SiH_2CL_2$ approximately constant within approximately the range 0.2-0.5 slm, such as 0.25-0.4 slm or 0.30-0.35 slm, for example, slm;
- flow of $B_2H_6$ according to an approximately increasing linear ramp, varying from approximately 20 to 200 sccm, such as from approximately 50 to 150 sccm, for example, from 60 to 120 sccm;
- growth time between approximately 150 and 500 s, for example, 300 s.

Etching Step

The range of the parameters for this step may be:

- pressure within approximately the range 10-400 Torr, such as 50-150 Torr or 60-100 Torr, for example, 80 Torr;
- flow of the $H_2$ vector approximately within the range 10-50 l, such as 15-30 l or 22-27 l, for example, 25 l;
- temperature approximately within the range 750-1250° C., such as 1000-1200° C. or 1050-1150° C., for example, 1100° C.;
- flow of HCl approximately between 0.1 to 2 l, such as 0.2-0.8 l or 0.4-0.6 l, for example, 0.5 l;
- etching time approximately between 30 and 150 s, such as between 60 and 120 s, for example, 90 s.

Figure 12:
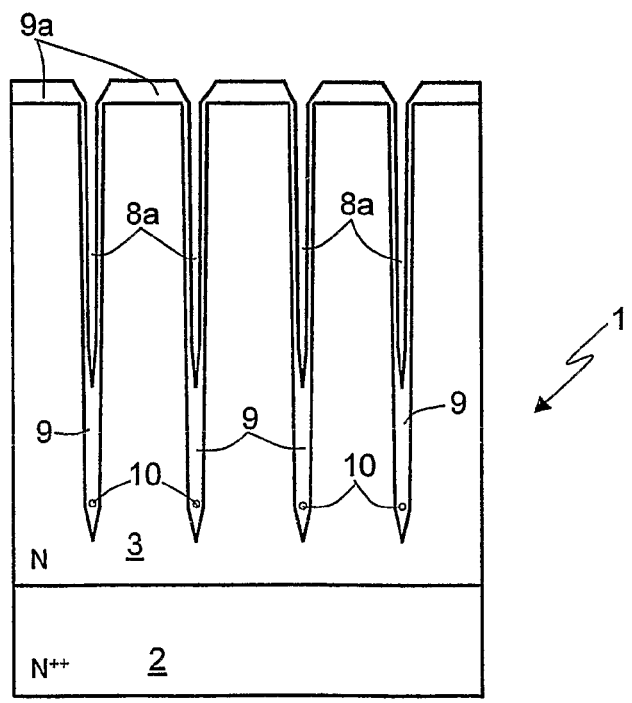
Figure 13:
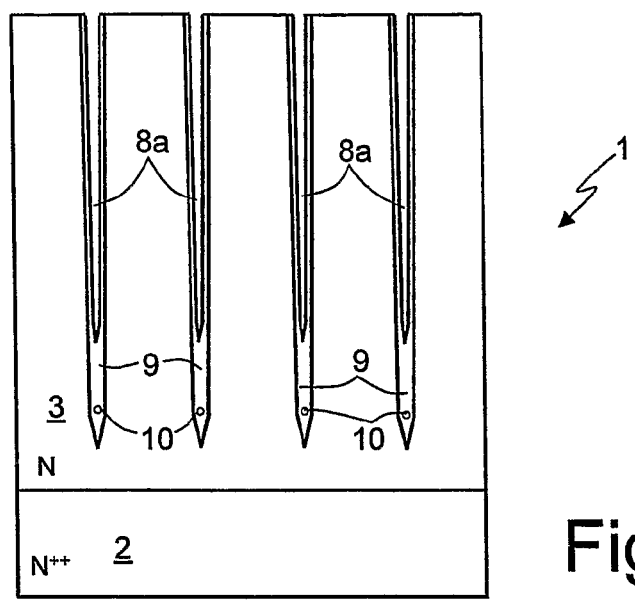
Figure 14:
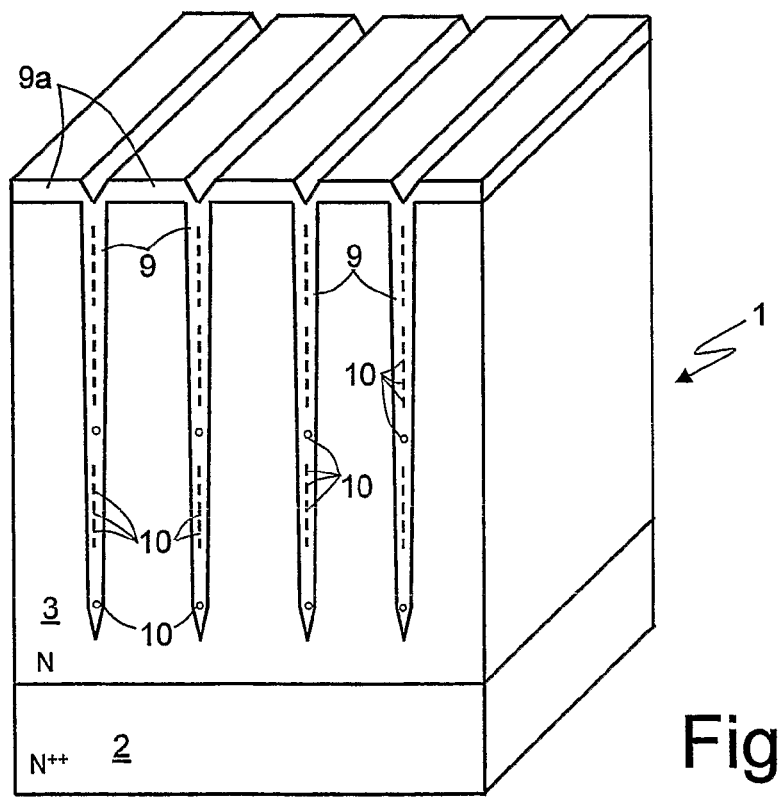

FIGS. 12-14 show various steps of the multi-step process and, namely, FIG. 12 shows the structure after a first growth step; in this step growth of the filling regions 9 starts, with simultaneous formation of surface portions 9a, which would risk, together with the portions growing on the walls of the trenches 8a near the surface 4, choking the top part of the trenches 8a. The growth step is then followed by an etching step, and the structure obtained is shown in FIG. 13, wherein the surface portions 9a and part of the top portion of the filling regions 9 have been removed. FIG. 14 shows the structure at the end of the growth steps, wherein the filling regions 9 have filled completely the trenches 8a, and the surface portions 9a are present.

In practice, in the embodiment of FIGS. 10-14, the process of growth occurs also on the surface, which, at the end of the process, has a characteristic horizontal layer of a P type with grooves set at the openings of the ex-trenches. The horizontal P layer, designated again by 9a, is present also on the periphery of the device (not shown) where there are no columns. In this case, the P layer 9a can be used as ring layer of the edge structure of the device that is to be made.

Figure 15:
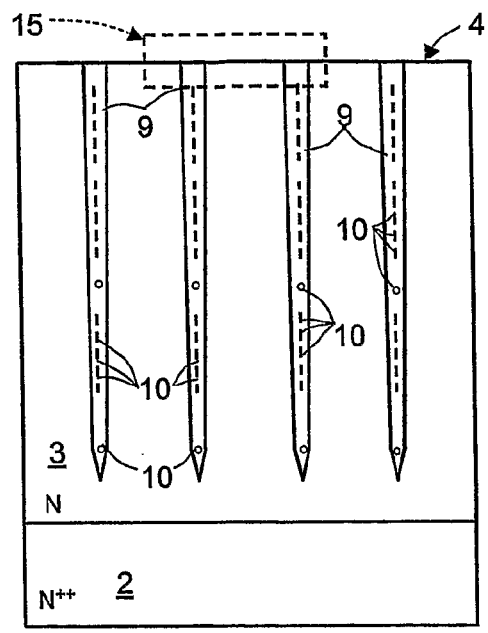
Figure 16:
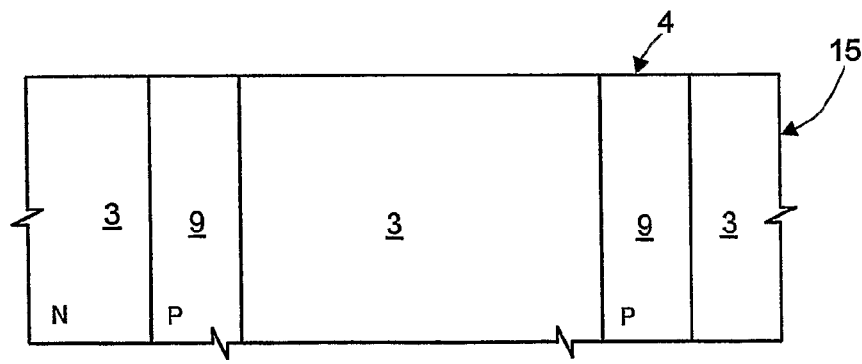
FIGS. 16 to 21 are cross-sections through a semiconductor wafer in successive manufacturing steps of an MD-trench device according to an embodiment of the disclosure.

Alternatively, when a planar surface is required, the structure of FIG. 14 may be subjected to a planarization, for example via chemical-mechanical polishing (CMP) so as to expose the surface 4 of the wafer, as shown in FIG. 15.

Some embodiments of power devices based upon the structure with charge-balance trenches obtained according to FIGS. 1-9 or FIGS. 10-15, are described hereinafter, in the latter case, after planarizing the wafer 1.

In particular, for a same thickness of the epitaxial layer, the depth of the trenches determines the class of voltage of the final device: for example, trenches 8 (and hence filling regions 9) having a depth of 5 μm enable devices to be obtained capable of withstanding voltages of up to 100 V, whereas trenches 8 having a depth of 30 μm enable devices capable of withstanding voltages of up to 600 V to be obtained. In general, the solutions described herein may be suitable for devices with breakdown voltages of approximately between 100 and 1700 V.

FIGS. 16-20 represent only one surface portion of the wafer 1, which contains two strips and is highlighted in FIG. 15 by a dashed rectangle 15.

Initially, in a way not shown, an edge region of the device may be formed along the perimeter of the device, in a per se known manner.

Figure 17:
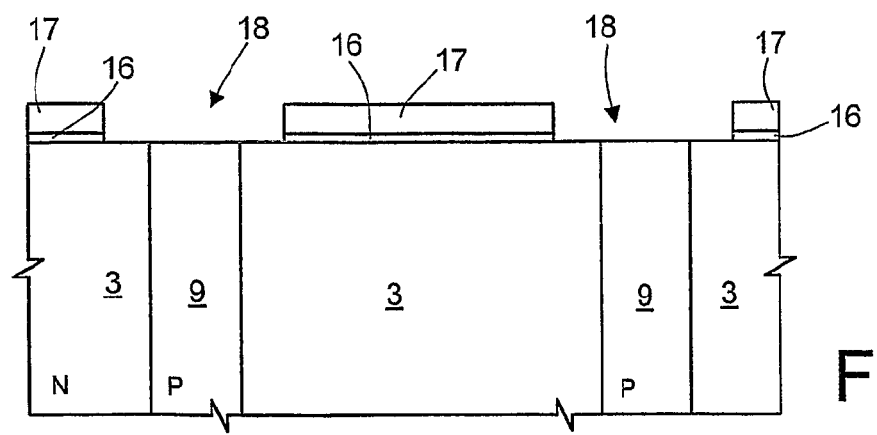

Then, in the active area, an oxide layer 16 (gate oxide) having a thickness approximately between 20 nm and 150 nm is first thermally grown, and then a polysilicon layer 17 having a thickness of approximately between 200 and 700 nm is deposited. The polysilicon layer 17 and oxide layer 16 are etched using a resist mask aligned by appropriate zero-layer techniques so as to form openings 18 overlying the filling regions 9, referred to also as columns 9 (FIG. 17). Alternatively, the oxide layer may even not be etched, and the subsequent implantations are made through said oxide.

Figure 18:
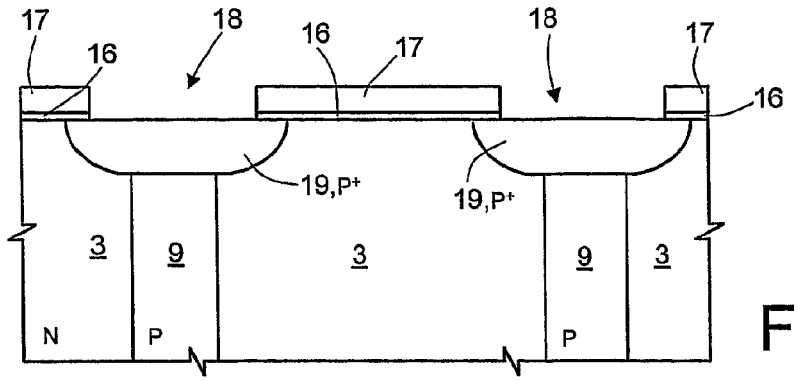

Using the openings 18, a body implantation is performed; in particular, boron may be implanted with an implantation dose of approximately between $1 \times e^{13}$ and $1 \times e^{14}$ atoms/cm$^2$ and energy of approximately between 80 and 200 keV. After a thermal diffusion process has been carried out, the structure of FIG. 18 is obtained, wherein the body regions of a P+ type are designated by 19.

Figure 19:
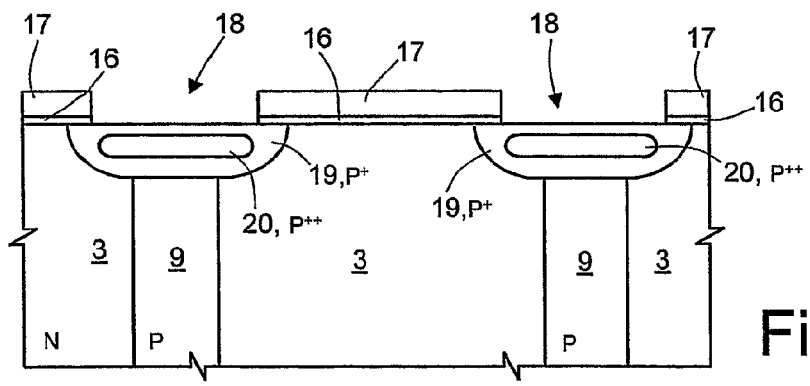

Then (FIG. 19), using a mask (not shown), a deep body implantation is performed; in particular, boron may be implanted with an implantation dose of approximately between $5 \times e^{14}$ and $5 \times e^{15}$ atoms/cm$^2$ and energy of approximately between 80 and 300 keV. After a thermal activation process has been carried out, the structure of FIG. 19 is obtained, wherein the deep-body regions of a P++ type are designated by 20.

Figure 20:
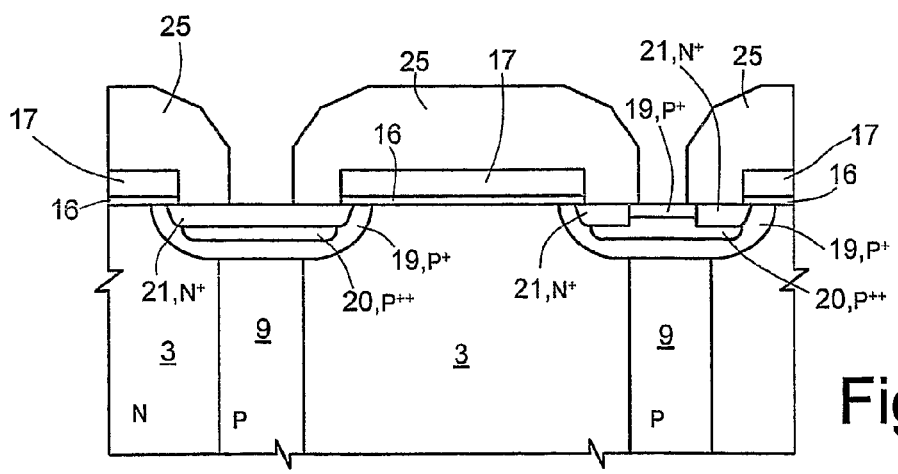

Next (FIG. 20), using a mask (not shown), a source implantation is performed; in particular, phosphorus or arsenic may be implanted with an implantation dose approximately between $5 \times e^{14}$ and $5 \times e^{15}$ atoms/cm$^2$ and energy approximately between 60 and 200 keV so as to form source regions 21 within the body regions 19. An intermediate dielectric layer 25 may then be deposited with a thickness between 500 nm and 1 μm, and a thermal activation process is carried out. Then the contacts are opened, and the structure of FIG. 20 is obtained. The process of etching the intermediate dielectric layer 25 may be entirely dry or be for a first part a wet etch and for a second part a dry etch.

Next, through a sputtering process, metallization of the front of the wafer 1 may be obtained. Then, a metal layer 26 may be formed, the thickness whereof depends upon the current-carrying capacity required for the device (FIG. 21).

The process proceeds with final known steps, including etching the metal layer 26, depositing a passivation layer, and a subsequent step of masking and etching the passivation layer. Finally, the process of finishing of the back follows.

Figure 21:
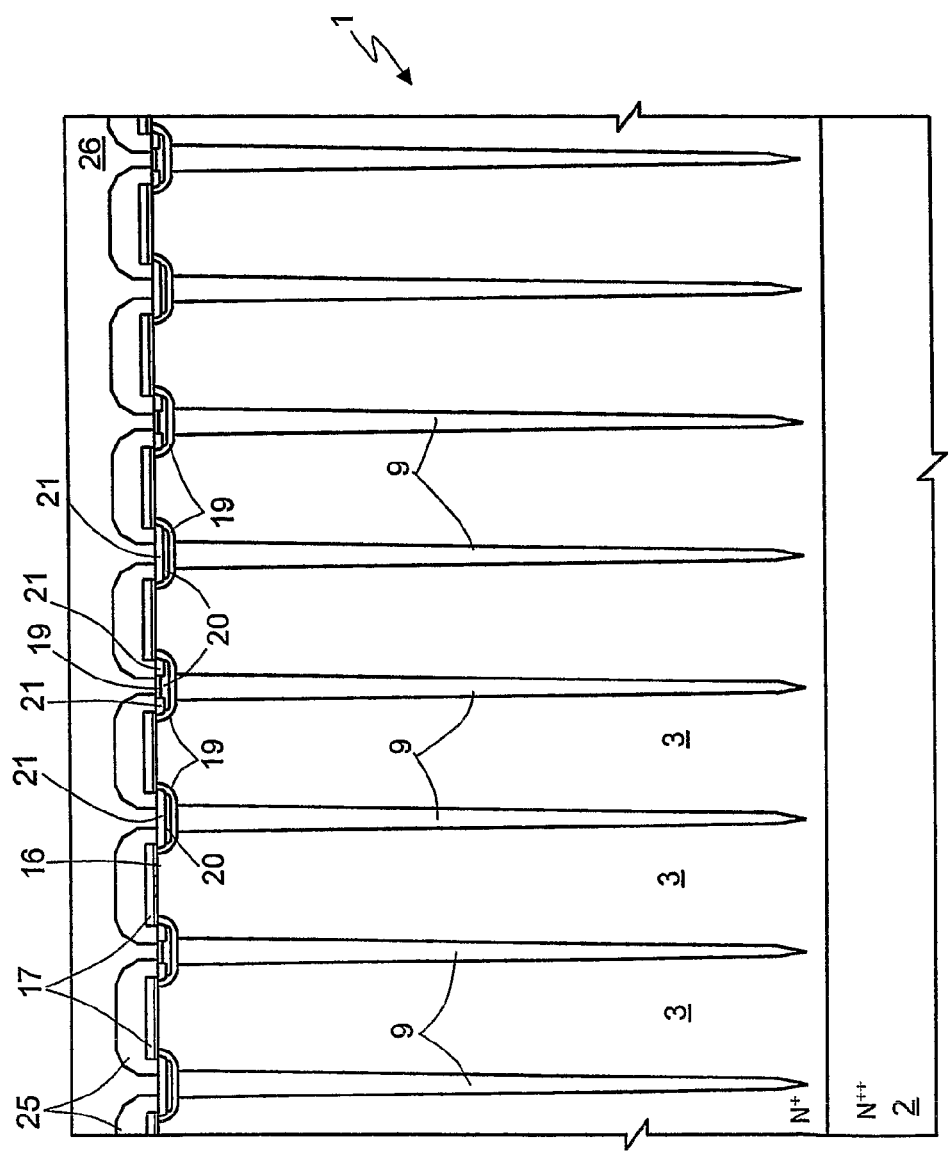
Figure 22:
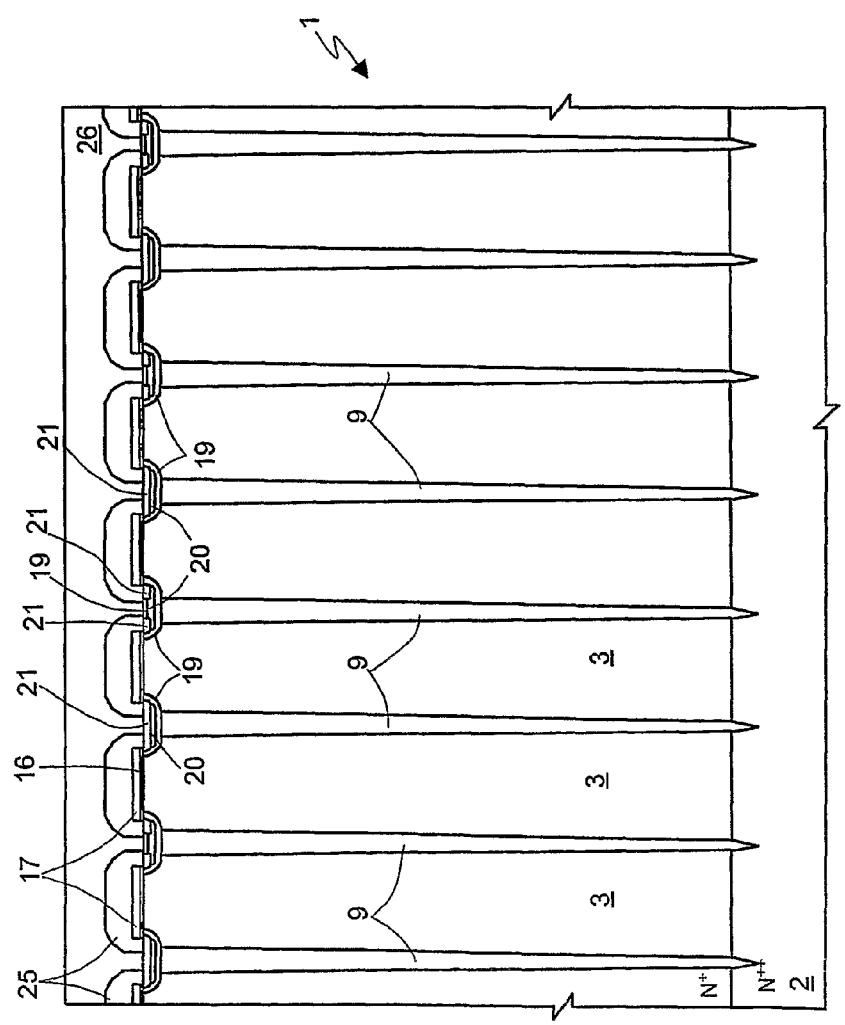
FIG. 22 is a cross-section of a variant of the device of FIG. 21 according to an embodiment of the disclosure.

FIG. 22 shows a variant of the structure of FIG. 21, wherein the columns 9 extend throughout the thickness of the epitaxial layer 3 and terminate at the bottom within the substrate 2.

Figure 23:
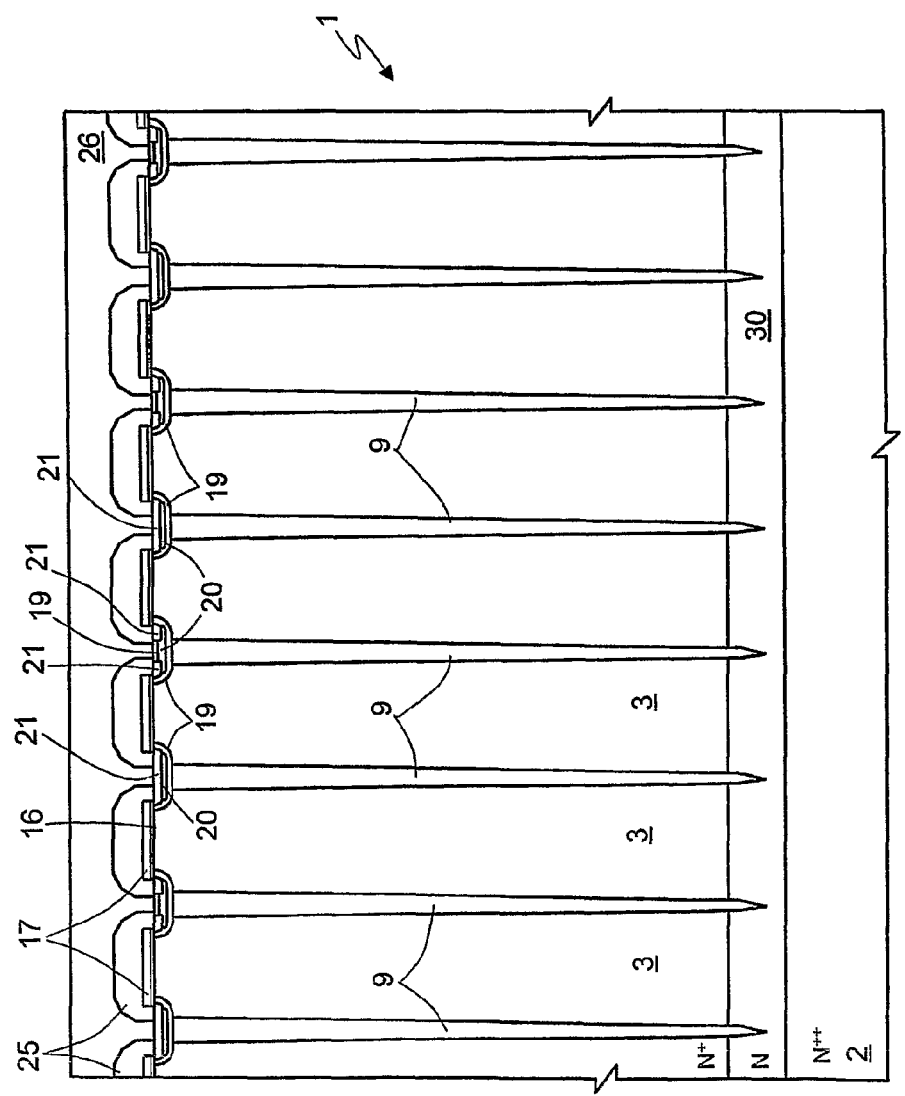
FIG. 23 is a cross-section of another variant of the device of FIG. 21 according to an embodiment of the disclosure.

FIG. 23 shows a variant of the structure of FIG. 21, wherein a buffer layer 30 of N type and resistivity approximately between 100 mΩcm and 5 Ωcm extends between the substrate 2 and the epitaxial layer 3. In this case, the columns 9 terminate within the buffer layer 30.

Advantages of the described process are outlined hereinafter. First, the process may ensure a high doping uniformity in all directions, whether vertical or horizontal, thanks to the variation in the flow of the gases containing silicon. This variation, in a decreasing direction in case of selective growth and in an increasing direction in case of non-selective growth, may be, in fact, fundamental for obtaining charge balance, and hence a proper operation of charge-balance devices, in so far as spatial fluctuations in the charge of the columns 9 entail a reduction in the production yield as well as a reduction in the voltage that can be withstood by the finished devices.

In addition, the processes described may be particularly simple to implement as compared to processes that require a plurality of steps of epitaxial growth, and hence enables a reduction in the cycle time. This means that the costs for manufacturing the devices may be considerably lower than those of known processes.

Furthermore, as compared to processes that require a plurality of steps of epitaxial growth, these processes may give an epitaxial layer of a much better quality, with reduced defectiveness.

In particular, it is emphasized that the first embodiment may be able to prevent, in a repeatable and reliable way, formation of voids. In the case of the second embodiment, empty areas may remain within the structure having dimensions much smaller than those that are obtained with known processes. In particular, tests have shown that with the process described two microbubbles are obtained, one of which in the proximity of the bottom and the other approximately half way up, and a line of suture in a median position. These imperfections are in any case much smaller than those obtainable with known processes and practically have no effect from the standpoint of charge balance, and hence of the electrical behavior of the finished device from the standpoint of charge balance.

With the described processes, it is possible to obtain devices of different classes of voltage (from mean voltages 100-150 V up to 1000-1700 V) by varying only the depth of the trenches, and hence with substantially the same costs.

In addition, it enables improvements in performance in so far as is possible to increase the density of the strips (further reducing the resistivity of the epitaxy) by appropriately varying the process of epitaxial filling.

Finally, it is clear that numerous modifications and variations can be made to the process and device described and illustrated herein, all falling within the scope of the disclosure. For example, even though the process described refers to a wafer of an N type provided with columns of a P type, it is possible to obtain dual structures. For example, a system, such as an automobile, may include a power device as described above.

The invention claimed is:

1. A semiconductor power device comprising:
   a first semiconductor layer of a first conductivity having a first dopant concentration;
   a second semiconductor layer of the first conductivity adjacent the first semiconductor layer and having a second dopant concentration higher than the first dopant concentration;
   a trench in said first semiconductor layer and partially extending into the second semiconductor layer; and
   a first column comprising semiconductor material within the trench and having a spatially uniform distribution of dopant ions of a second conductivity type;
   said first column having a width between 0.8 and 2 μm, and a depth between 3 and 50 μm.

2. The semiconductor power device according to claim 1 wherein said first column has a depth between 5 and 30 μm.

3. The semiconductor power device according to claim 1 further comprising at least one second column spaced apart from said first column.

4. The semiconductor power device according to claim 3 further comprising insulated-gate regions extending above the first semiconductor layer, between said first and at least one second columns.

5. The semiconductor power device according to claim 4 further comprising body regions of the second conductivity type extending in the first semiconductor layer, said body regions being aligned to and having a doping level greater said columns.

6. The semiconductor power device according to claim 5 further comprising source regions of the first conductivity type extending within the body regions.

7. The semiconductor power device according to claim 6 further comprising metal contact regions extending above the first semiconductor layer and the insulated-gate regions and in electrical contact with the body regions and the source regions.

8. The semiconductor power device according to claim 3 wherein a distance between two adjacent columns is between 2 and 6 μm.

9. The semiconductor power device according to claim 8 a sum of a width of a column and of the distance between adjacent columns is between 1 and 10 μm.

10. The semiconductor power device according to claim 8 a sum of a width of a column and of the distance between adjacent columns is between 5 and 10 μm.

11. The semiconductor power device according to claim 1 wherein predetermined crystalline planes are exposed on a bottom of the trench, and on side walls of the trench.

12. The semiconductor power device according to claim 1 wherein the first column includes no voids.

13. A semiconductor power device comprising:
- a first semiconductor layer of a first conductivity having a first dopant concentration;
- a second semiconductor layer of the first conductivity adjacent the first semiconductor layer and having a second dopant concentration higher than the first dopant concentration;
- a trench in said first semiconductor layer and partially extending into the second semiconductor layer; and
- a first column comprising semiconductor material within the trench and having a spatially uniform distribution of dopant ions of a second conductivity type, said first column having no void therein.

14. The semiconductor power device according to claim 13 further comprising at least one second column spaced apart from said first column.

15. The semiconductor power device according to claim 14 further comprising insulated-gate regions extending above the first semiconductor layer, between said first and at least one second columns.

16. The semiconductor power device according to claim 15 further comprising body regions of the second conductivity type extending in the first semiconductor layer, said body regions being aligned to and having a doping level greater said columns.

17. The semiconductor power device according to claim 16 further comprising source regions of the first conductivity type extending within the body regions.

18. The semiconductor power device according to claim 13 wherein predetermined crystalline planes are exposed on a bottom of the trench, and on side walls of the trench.

* * * * *